(12) United States Patent
Ha et al.

(10) Patent No.: US 7,349,290 B2
(45) Date of Patent: Mar. 25, 2008

(54) SEMICONDUCTOR MEMORY DEVICE

(75) Inventors: Sung-Joo Ha, Kyoungki-do (KR);
Ho-Youb Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 124 days.

(21) Appl. No.: 11/323,687

(22) Filed: Dec. 30, 2005

(65) Prior Publication Data
US 2006/0280025 A1 Dec. 14, 2006

(30) Foreign Application Priority Data
Jun. 9, 2005 (KR) .................. 10-2005-0049267

(51) Int. Cl.
*G11C 8/00* (2006.01)

(52) U.S. Cl. ...................... 365/233; 365/194
(58) Field of Classification Search ................ 365/233, 365/194, 189.05
See application file for complete search history.

(56) References Cited

U.S. PATENT DOCUMENTS

| 5,513,327 | A | 4/1996 | Farmwald et al. | |
|---|---|---|---|---|
| 6,519,188 | B2 * | 2/2003 | Ryoo et al. | 365/189.05 |
| 6,807,598 | B2 | 10/2004 | Farmwald et al. | |
| 6,813,195 | B2 * | 11/2004 | Bang et al. | 365/189.12 |
| 6,914,829 | B2 | 7/2005 | Lee | |
| 6,980,479 | B2 * | 12/2005 | Park | 365/233 |
| 7,116,589 | B2 * | 10/2006 | Stubbs | 365/194 |

FOREIGN PATENT DOCUMENTS

| JP | 2003-320261 A | 11/2003 |
|---|---|---|
| KR | 1020020021714 A | 3/2002 |
| KR | 1020040043700 A | 5/2004 |
| KR | 1020040086683 A | 10/2004 |
| KR | 1020050011984 A | 1/2005 |

* cited by examiner

*Primary Examiner*—Anh Phung
(74) *Attorney, Agent, or Firm*—Blakely Sokoloff Taylor & Zafman

(57) ABSTRACT

A semiconductor memory device is provided. The semiconductor memory device includes: a first input/output control unit for changing a sensing node into a first level in response to an activation of a first enabling signal for enabling an output of a data synchronized with a rising edge of a clock signal; a second input/output control unit for changing the sensing node into a second level in response to a delay locked clock signal as the second input/output control unit is enabled when the first enabling signal and a second enabling signal for enabling an output of a data synchronized with a falling edge of the clock signal are disabled; an output unit for outputting an input/output control signal; and a data output driver for outputting a data as the data output driver is activated in response to a first level of the input/output control signal.

9 Claims, 7 Drawing Sheets

SEMICONDUCTOR MEMORY DEVICE

FIELD OF THE INVENTION

The present invention relates to a semiconductor memory device; and, more particularly, to an input/output control unit for a data input/output in a semiconductor memory device. Although the present invention shows a specific application of the semiconductor memory device, various other applications are possible.

DESCRIPTION OF RELATED ARTS

Semiconductor memory devices have improved operation speed along with large scale integration of such devices. Synchronous memory devices which operate synchronized with an external clock have been introduced to improve the operation speed.

The initially introduced synchronous memory device is a single data rate (SDR) synchronous memory device, which inputs and outputs one data for one period at one input/output data pin as the SDR synchronous memory device is synchronized with a rising edge of an external clock. However, the SDR synchronous memory device is insufficient to satisfy further increases in operation speed. Thus, double data rate (DDR) synchronous memory devices have been proposed. DDR synchronous memory devices process two sets of data per one clock period.

More specifically, the DDR synchronous memory device inputs and outputs two sets of data consecutively through each input/output data pin as the DDR synchronous memory device is synchronized with a rising edge and a falling edge of an external clock. Thus, a bandwidth of the DDR synchronous memory device can be increased at least two times more than that of the SDR synchronous memory device without increasing a frequency of the clock. As a result, the DDR synchronous memory device can be realized with a higher operation speed.

FIG. 1 is a block diagram illustrating a data output part of a conventional semiconductor memory device.

The data output part includes: a data input buffer 10 transmitting a data signal from a data input/output pad DQ PAD to a memory core region; a data output driver 20 transmitting a data from the memory core region to the data input/output pad DQ PAD; and an input/output control block 30 controlling the data input buffer 10 and the data output driver 20.

FIG. 2 is a circuit diagram illustrating the conventional input/output control block illustrated in FIG. 1.

The input/output control block 30 includes: a signal combination unit 31 combining a first control signal ROUTEN, which enables a data output at a rising edge, with a second control signal RCLK_DLL outputted from a delay locked loop; and an output unit 32 latching a combination result from the signal combination unit 31 and outputting a latched signal.

FIG. 3 is a waveform diagram showing operation of the conventional semiconductor memory device illustrated in FIGS. 1 and 2.

With reference to FIGS. 1 to 3, the operation of the conventional semiconductor memory device will be described in detail.

Generally, the conventional semiconductor memory device shares input pins and output pins to decrease the number of data pads. Hence, the data output driver 20 needs to be disabled to input a data, and a data input buffer needs to be disabled to output a data. An input/output signal OUTOFF is a signal required for controlling the above operation. The input/output signal OUTOFF maintains a disabled state at a low level while a data is outputted and an enabled state at a high level while a data is not outputted.

The first control signal ROUTEN which makes a data synchronized with a rising edge of a clock signal be outputted and the second control signal RCLK_DLL, which is generated internally to compensate for a skew between the data synchronized with the rising edge of the clock signal and the external clock, are used to generate the input/output signal OUTOFF.

When the first control signal ROUTEN is changed into a high level, the input/output control signal OUTOFF is changed into a low level to make the data output driver 20 be enabled. The first control signal ROUTEN is then changed into a low level in response to the nth clock of the second control signal RCLK_DLL, where n is a positive number.

After the first control signal ROUTEN is changed into the low level, due to a delaying device 33, the first control signal ROUTEN is transmitted to an inverter 11 after a predetermined delay time. The input/output control signal OUTOFF is disabled into a high level by the second control signal RCLK_DLL inputted after the predetermined delay time.

FIGS. 4 and 5 are waveform diagrams showing limitations of the input/output control block illustrated in FIG. 2.

The semiconductor memory device can operate as described above when the predetermined delay time by the delaying device 33 is longer than a width of a target pulse of the second control signal RCLK_DLL. If the delay time is shorter than the width of the target pulse of the second control signal RCLK_DLL depending on process conditions, operation voltage and temperature, the input/output control signal OUTOFF is changed into a high level more rapidly than an expected time as shown in FIG. 5. Thus, the data output driver 20 is disabled more rapidly.

As a result of the above rapid change, among the data outputted consecutively, depending on the length of a bus, the last data may not be outputted for a sufficient time. Accordingly, among the data outputted for one output operation, the last data may not be outputted fully, resulting in various systematic errors.

SUMMARY OF THE INVENTION

It is, therefore, an object of the present invention to provide a semiconductor memory device capable of outputting an intended amount of data by securing an enabling interval of a data output driver.

In accordance with an aspect of the present invention, there is provided a semiconductor memory device outputting data synchronized with a rising edge and a falling edge of a clock signal, the semiconductor memory device including: a first input/output control unit for changing a sensing node into a first level in response to an activation of a first enabling signal for enabling an output of a data synchronized with a rising edge of the clock signal; a second input/output control unit for changing the sensing node into a second level in response to a delay locked clock signal outputted from a delay locked loop as the second input/output control unit is enabled when the first enabling signal and a second enabling signal for enabling an output of a data synchronized with a falling edge of the clock signal are disabled; an output unit for outputting an input/output control signal corresponding to a changed state of the sensing node; and a data output driver for outputting a data transmitted from a memory core region as the data output driver is activated in response to a first level of the input/output control signal.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor memory device in accordance with specific embodiments of the present invention will be described in detail with reference to the accompanying drawings.

Figure 1:
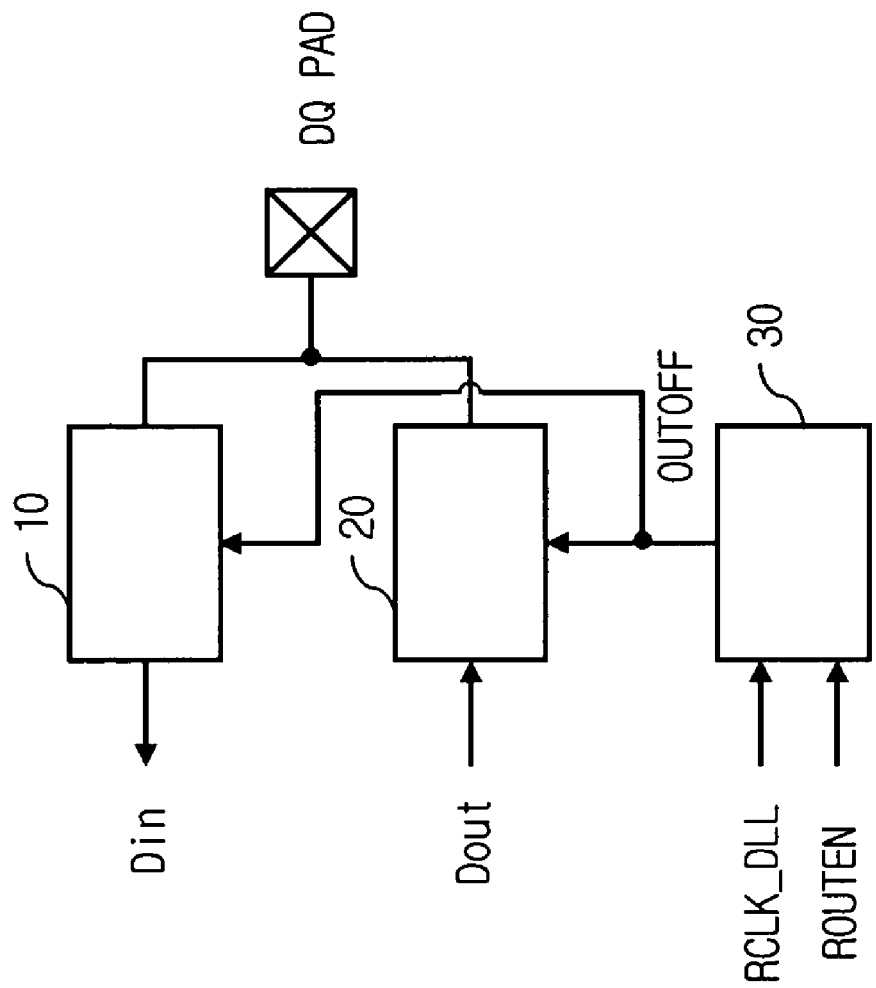
FIG. 1 is a block diagram illustrating a data output part of a conventional semiconductor memory device.
Figure 2:
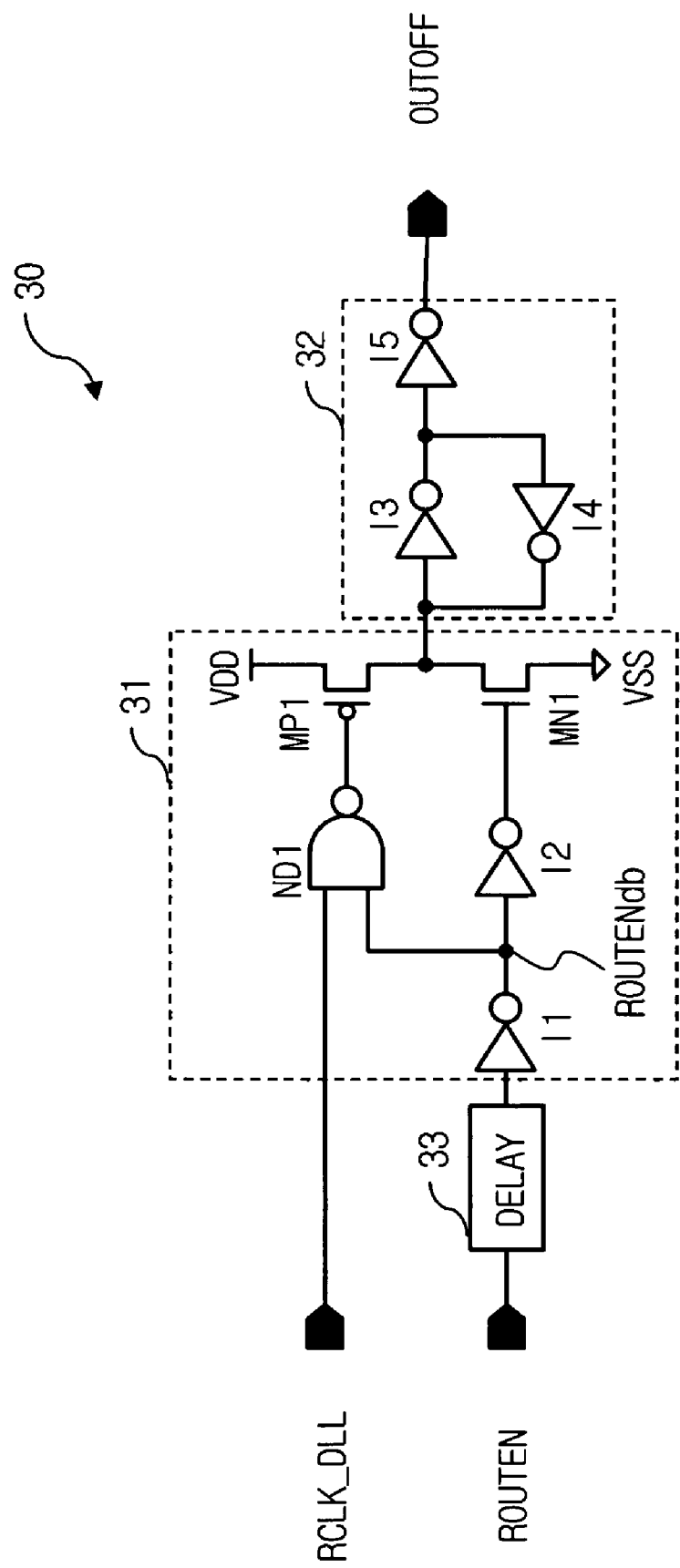
FIG. 2 is a circuit diagram illustrating a conventional input/output control block illustrated in FIG. 1.
Figure 3:
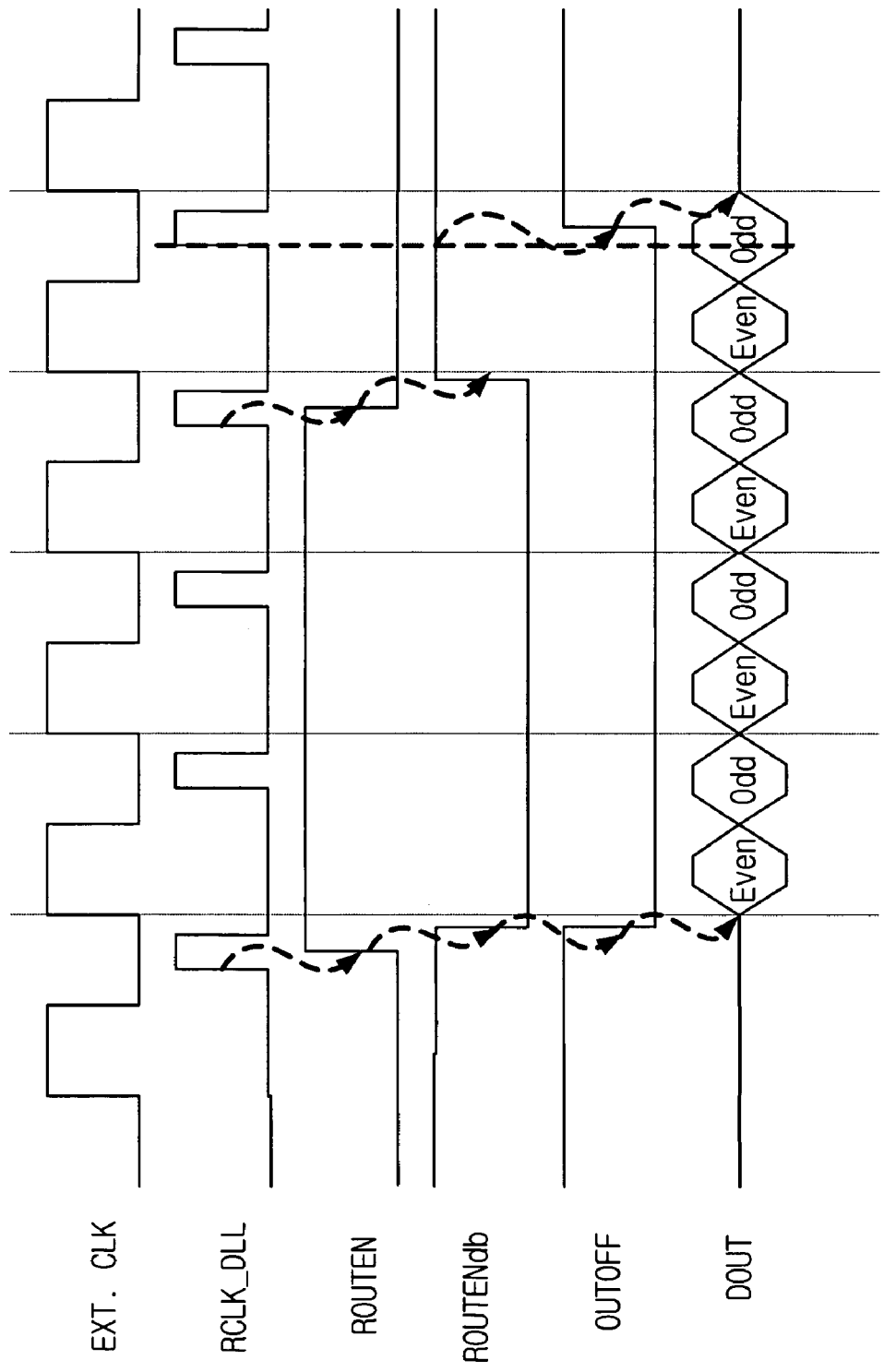
FIG. 3 is a waveform diagram showing operation of the conventional semiconductor memory device illustrated in FIGS. 1 and 2.
Figure 4:
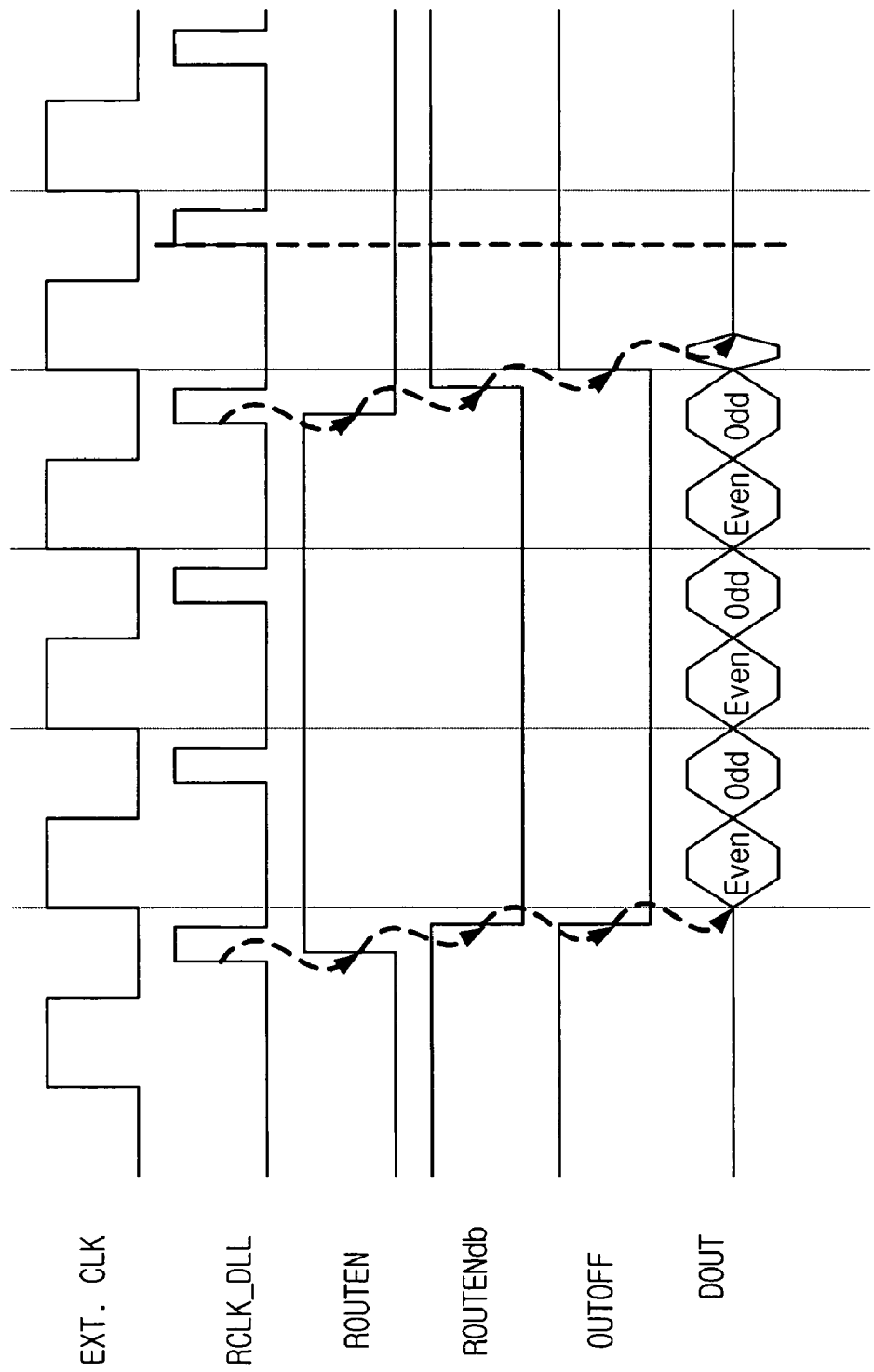
FIGS. 4 and 5 are waveform diagrams showing limitations of the input/output control block illustrated in FIG. 2.
Figure 5:
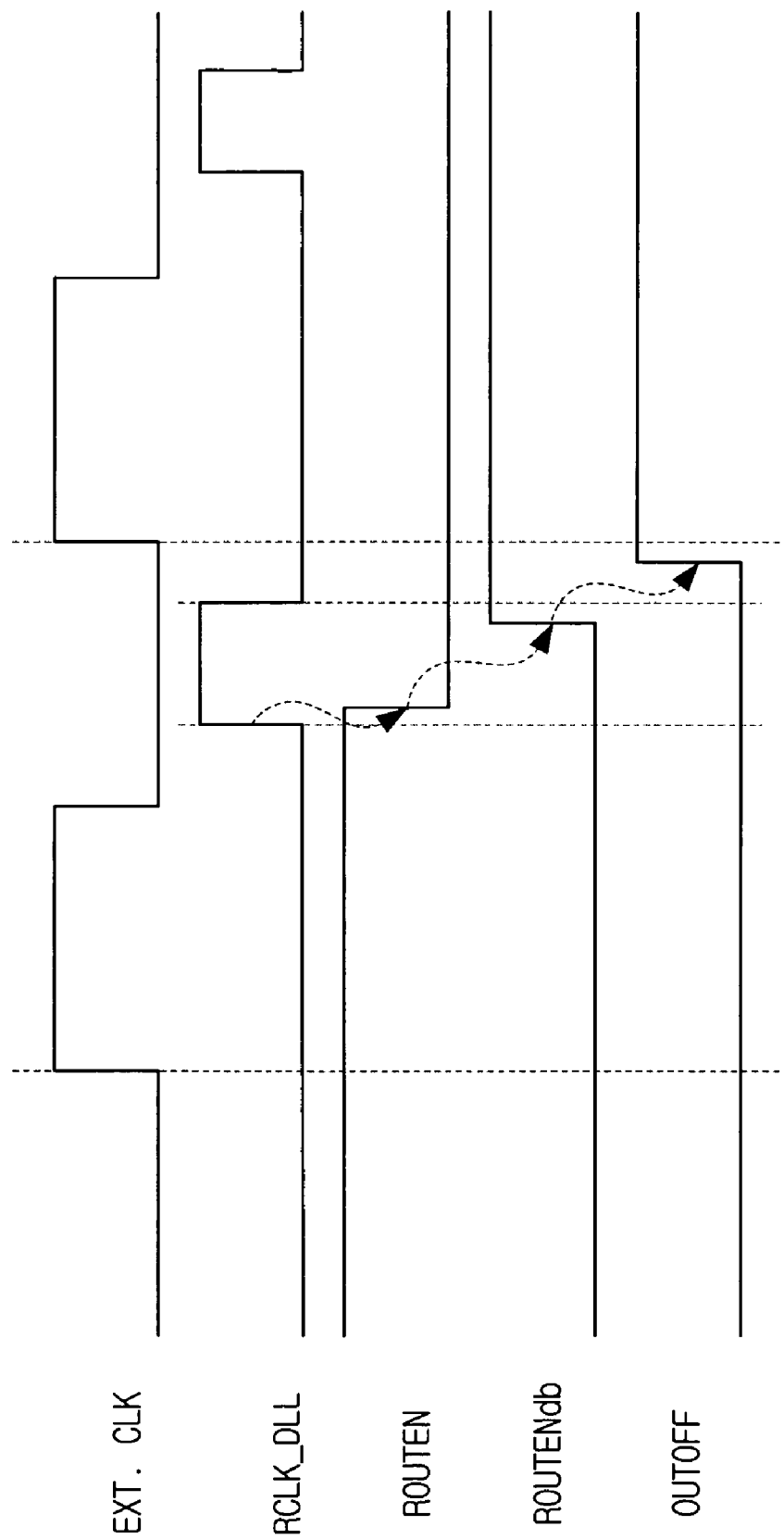
Figure 6:
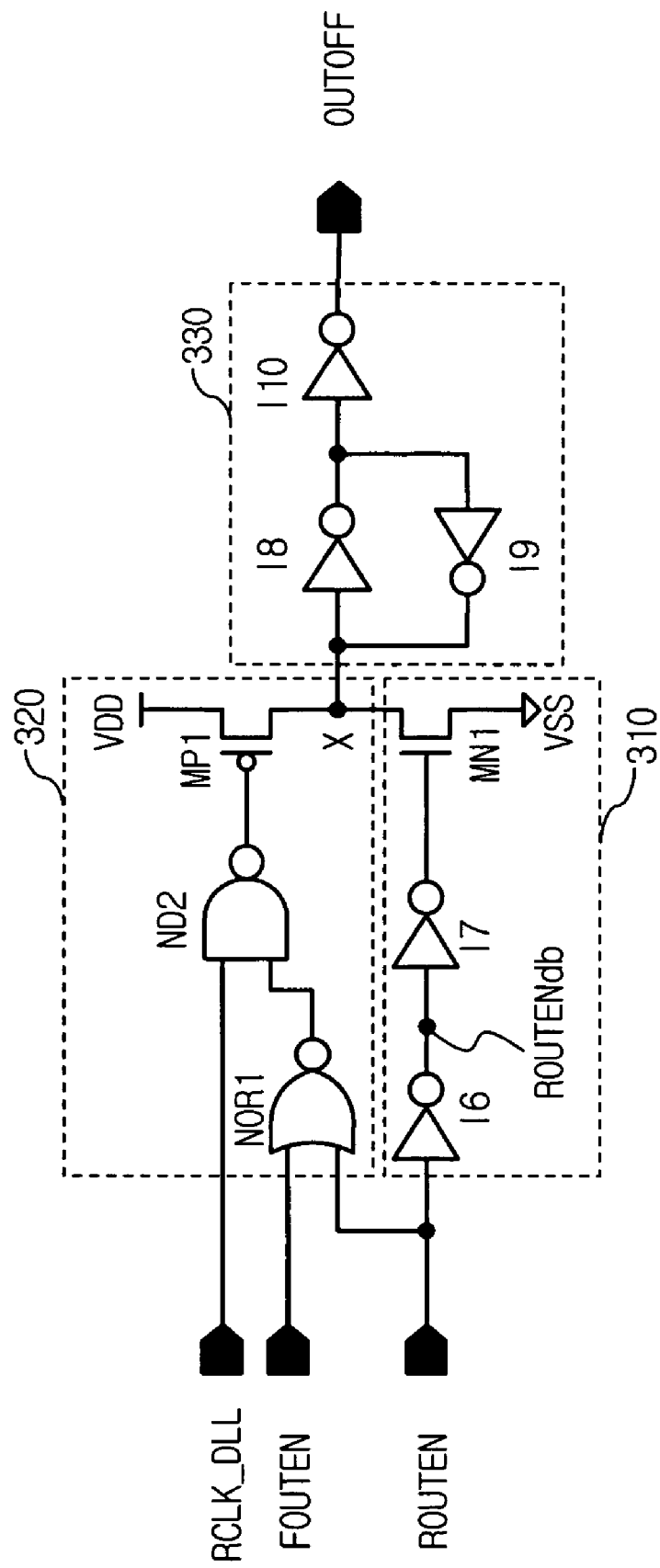
FIG. 6 is a circuit diagram illustrating a semiconductor memory device in accordance with a specific embodiment of the present invention.

FIG. 6 is a circuit diagram illustrating a semiconductor memory device in accordance with a specific embodiment of the present invention.

The semiconductor memory device outputs data by being synchronized with a rising edge and a falling edge of a clock signal. The semiconductor memory device includes: a first input/output control unit 310; a second input/output control unit 320; an output unit 330; and a data output driver (not shown). The first input/output control unit 310 changes a sensing node X into a low level in response to an activation of a first enabling signal ROUTEN for enabling an output of a data synchronized with a rising edge of the clock signal. The second input/output control unit 320 changes the sensing node X into a high level in response to a delay locked clock signal RCLK_DLL, which is outputted from a delay locked loop as the second input/output control unit 320 is enabled when the first enabling signal ROUTEN and a second enabling signal FOUTEN for enabling an output of a data synchronized with a falling edge of the clock signal are disabled. The output unit 330 outputs an input/output control signal OUTOFF corresponding to a changed state of the sensing node X. Although not illustrated, the data output driver outputs a data transmitted from a memory core region as the data output driver is activated in response to a low level of the input/output control signal OUTOFF. The semiconductor memory device further includes a data input buffer. The data input buffer transmits a data, which is inputted from outside in response to a high level of the input/output control signal OUTOFF, into the memory core region.

The first input/output control unit 310 includes: a first buffer I6 and a second buffer I7 buffering and transmitting the first enabling signal ROUTEN; and a first MOS transistor MN1 performing a pull-down operation of the sensing node X in response to an output of the first and second buffers I6 and I7.

The second input/output control unit 320 includes: a NOR gate NOR1 receiving the first enabling signal ROUTEN and the second enabling signal FOUTEN; a NAND gate ND2 receiving an output from the NOR gate NOR1 and the delay locked clock signal RCLK_DLL; a second metal oxide semiconductor (MOS) transistor MP1 performing a pull-up operation of the sensing node X in response to an output of the NAND gate ND2.

The output unit 330 includes: a first latching device I8 and a second latching device I9 latching a signal supplied to the sensing node X; and an inverter I10 inverting a latched signal from the first latching device I8 and the second latching device I9 and outputting the inverted signal.

Figure 7:
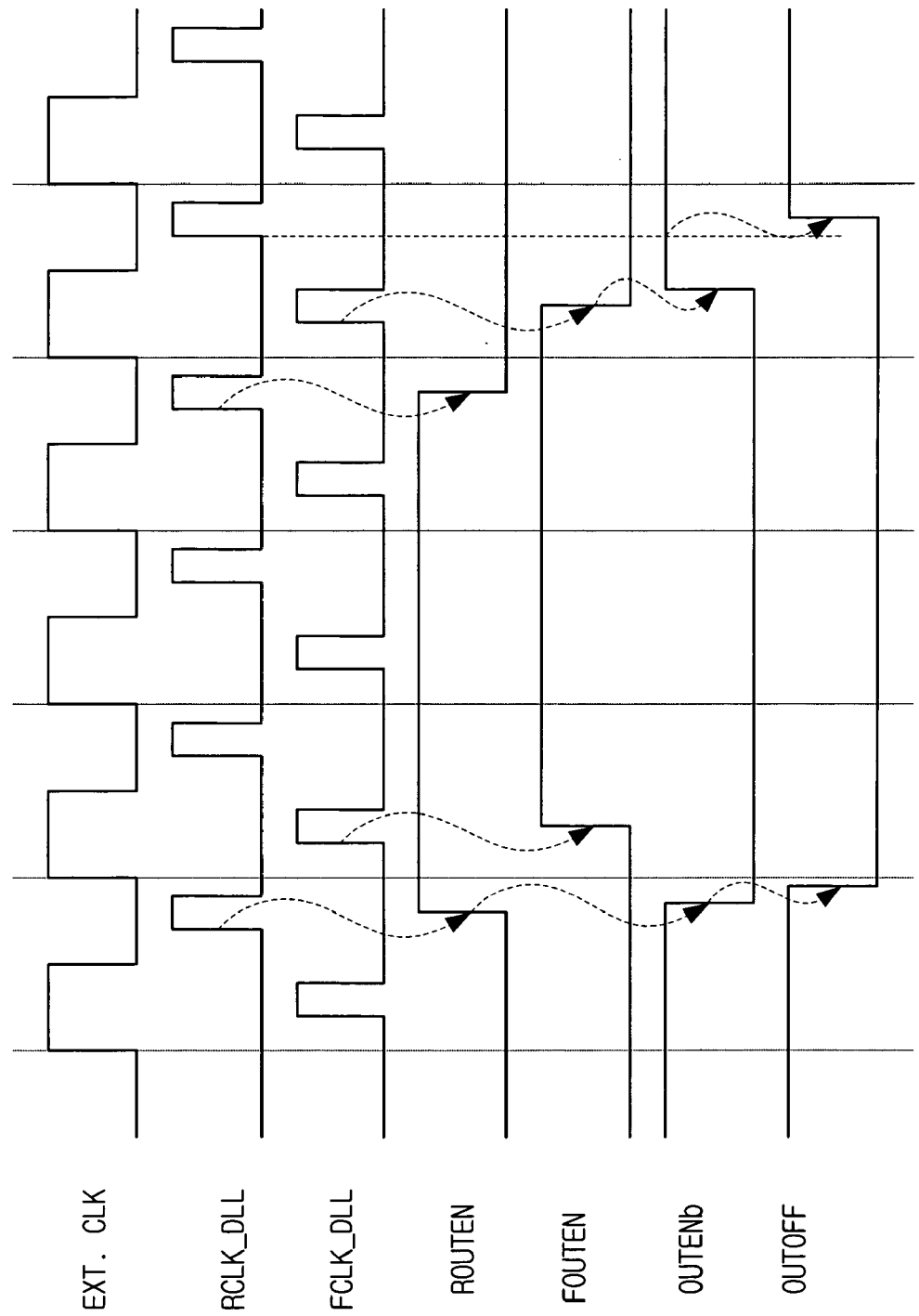
FIG. 7 is a waveform diagram showing operation of the semiconductor memory device illustrated in FIG. 6.

FIG. 7 is a waveform diagram showing operation of the semiconductor memory device illustrated in FIG. 6. With reference to FIGS. 6 and 7, the operation of the semiconductor memory device will be described in detail.

When the first enabling signal ROUTEN inputted to the first input/output control unit 310 is enabled at a high level, the first buffer I6 and the second buffer I7 buffer the first enabling signal ROUTEN, which subsequently turns on the first MOS transistor MN1. Turning on the first MOS transistor MN1 causes the sensing node X to be pulled down, thereby enabling the input/output control signal OUTOFF at a low level.

When it is necessary to disable the data output driver after the output of the data, the first enabling signal ROUTEN and the second enabling signal FOUTEN are disabled at a low level. This state of the first enabling signal ROUTEN and the second enabling signal FOUTEN indicates that an output of the NOR gate NOR1 of the second input/output control unit 320 is at a high level. The delay locked clock signal RCLK_DLL is at a high level, and this high level of the delay locked clock signal RCLK_DLL turns on the second MOS transistor MP1. As mentioned above, the delay locked clock signal RCLK_DLL is a signal outputted from a delay locked loop, which is internally provided, and used to eliminate a skew between the clock signal provided from outside and the data signal outputted from inside to outside.

As the second MOS transistor MP1 is turned on, the sensing node X is pulled up, thereby resulting a high level of the input/output control signal OUTOFF, which indicates a disabled state. When the input/output control signal OUTOFF is disabled, the data output driver is disabled.

According to the specific embodiment of the present invention, instead of using a delaying device, the semiconductor memory device uses a first enabling signal ROUTEN and a second enabling signal FOUTEN to activate or inactivate a data input/output control signal. Therefore, a data output driver is not disabled in the middle of outputting data.

The first enabling signal ROUTEN and the second enabling signal FOUTEN enables an output of a data synchronized with a rising edge of each clock signal and a data synchronized with a falling edge of each clock signal. A clock of the second enabling signal FOUTEN runs behind approximately one half of that of first enabling signal ROUTEN.

Accordingly, since the data output driver can maintain an activation state for a sufficient time while data are outputted, it is possible to stably output an intended amount of the data corresponding to a burst length of the clock signal. Hence, the application of such semiconductor memory device makes it further possible to realize a system with enhanced reliability.

The present application contains subject matter related to the Korean patent application No. KR 2005-0049267, filed in the Korean Patent Office on Jun. 9, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device outputting data synchronized with a rising edge and a falling edge of a clock signal, the semiconductor memory device comprising:
   a first input/output control unit for changing a sensing node into a first level in response to an activation of a first enabling signal for enabling an output of a data synchronized with a rising edge of the clock signal;
   a second input/output control unit for changing the sensing node into a second level in response to a delay locked clock signal outputted from a delay locked loop as the second input/output control unit is enabled when the first enabling signal and a second enabling signal for enabling an output of a data synchronized with a falling edge of the clock signal are disabled;
   an output unit for outputting an input/output control signal corresponding to a changed state of the sensing node; and
   a data output driver for outputting a data as the data output driver is activated in response to a first level of the input/output control signal.

2. The semiconductor memory device of claim 1, further including a data input buffer transmitting data as the data input buffer is activated in response to a second level of the input/output control signal.

3. The semiconductor memory device of claim 1, wherein the first input/output control unit includes:
   a first buffer and a second buffer buffering the first enabling signal and transmitting the buffered first enabling signal; and
   a first metal oxide semiconductor (MOS) transistor pulling down the sensing node in response to an output of the first and second buffers.

4. The semiconductor memory device of claim 3, wherein the second input/output control unit includes:
   a NOR gate receiving the first enabling signal and the second enabling signal;
   a NAND gate receiving an output of the NOR gate and the delay locked clock signal; and
   a second MOS transistor pulling up the sensing node in response to an output of the NAND gate.

5. The semiconductor memory device of claim 4, wherein the output unit includes:
   a first latching device and a second latching device latching a signal from the sensing node; and
   an inverter inverting the latched signal and outputting the inverted signal.

6. The semiconductor memory device of claim 1 wherein the data output by the data output driver is transmitted from a memory core region.

7. A semiconductor memory device outputting data synchronized with a rising edge and a falling edge of a DLL clock signal, comprising:
   a control signal generator for generating an output data controlling signal in response to a DLL clock signal, a first enabling signal and a second enabling signal,
   wherein the first enabling signal is for enabling an output of a first output data synchronized with a falling edge of the clock signal and a second enabling signal is for enabling an output of a second output data synchronized with a rising edge of the clock signal; and
   a data output driver for outputting data in response to the output data controlling signal,
   wherein the output data controlling signal is inactivated in response to a first clocking of the DLL clock after the first enabling signal and the second enabling signal are inactivated.

8. The semiconductor memory device of claim 7, further including a data input buffer activated in response to a logic level of the output data controlling signal.

9. The semiconductor memory device of claim 7, the control signal generator includes;
   a first logic combination unit for outputting a logic output in response to an activation of the first enabling signal and the second enabling signal;
   a second logic combination unit for changing a sensing node into a first logic level in response to an activation of the logic output;
   a third logic combination unit for changing the sensing node into a second logic level in response to an activation of the second enabling signal; and
   a fourth logic combination unit for outputting the output data controlling signal having a logic level corresponding to a changed state of the sensing node.

* * * * *

UNITED STATES PATENT AND TRADEMARK OFFICE
CERTIFICATE OF CORRECTION

PATENT NO. : 7,349,290 B2 Page 1 of 1
APPLICATION NO. : 11/323687
DATED : March 25, 2008
INVENTOR(S) : Ha et al.

It is certified that error appears in the above-identified patent and that said Letters Patent is hereby corrected as shown below:

Col. 6, Claim 6, line 2, please delete "by the data" and insert -- by said data --.

Signed and Sealed this

Sixteenth Day of September, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,349,290 B2 | Page 1 of 1 |
| APPLICATION NO. | : 11/323687 | |
| DATED | : March 25, 2008 | |
| INVENTOR(S) | : Ha et al. | |

It is certified that error appears in the above-identified patent and that said Letters Patent is hereby corrected as shown below:

Col. 6, Claim 6, line 10, please delete "by the data" and insert -- by said data --.

This certificate supersedes the Certificate of Correction issued September 16, 2008.

Signed and Sealed this

Seventh Day of October, 2008

JON W. DUDAS
*Director of the United States Patent and Trademark Office*